United States Patent
Garcia et al.

(10) Patent No.: US 6,714,028 B2
(45) Date of Patent: Mar. 30, 2004

(54) ROLLER CONTACT WITH CONDUCTIVE BRUSHES

(75) Inventors: Douglas J. Garcia, Beaverton, OR (US); Drew R. Verkade, Carlsbad, CA (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/282,350

(22) Filed: Oct. 28, 2002

(65) Prior Publication Data

US 2003/0090279 A1 May 15, 2003

Related U.S. Application Data

(60) Provisional application No. 60/335,146, filed on Nov. 14, 2001.

(51) Int. Cl.[7] .............................................. G01R 31/02
(52) U.S. Cl. ..................................... 324/754; 324/762
(58) Field of Search ................................ 324/754–757, 324/538, 762, 158.1

(56) References Cited

U.S. PATENT DOCUMENTS

| | | | |
|---|---|---|---|
| 2,653,298 A | 9/1953 | McKinley | .................... 324/65 |
| 3,915,850 A | 10/1975 | Crownover | .................... 209/74 |
| 4,786,876 A | * 11/1988 | Graham | ..................... 324/551 |
| 5,568,870 A | 10/1996 | Utech | ......................... 209/573 |
| 5,596,283 A | 1/1997 | Mellitz et al. | ............... 324/754 |
| 5,670,878 A | * 9/1997 | Katahara et al. | ............ 324/221 |
| 6,040,705 A | * 3/2000 | Garcia et al. | ................ 324/762 |
| 6,100,707 A | 8/2000 | Baumann et al. | ............ 324/761 |
| 6,204,464 B1 | * 3/2001 | Garcia et al. | ................ 324/757 |

* cited by examiner

Primary Examiner—Evan Pert
Assistant Examiner—Jermele M. Hollington
(74) Attorney, Agent, or Firm—Stoel Rives LLP

(57) ABSTRACT

A rolling contactor for providing electrical signal communication between a component terminal and a support structure for the rolling contactor, including an electrically conductive circular roller for rolling across the termination surface of a device under test (DUT), at least one electrically conductive circular spool, a support axle adapted to pass axially through the holes formed in the roller and the spool, an electrically conductive axle bracket adapted to support the axle to allow the roller surface to rotate and press against the termination surface of the DUT, an electrically conductive brush extending from the axle bracket to contact the spool, and an electrically conductive elongated spring arm extending between the axle bracket and the support structure, to complete the electrical path between the termination surface of the DUT, the roller surface and the spool.

20 Claims, 4 Drawing Sheets

ROLLER CONTACT WITH CONDUCTIVE BRUSHES

This application claims the benefit of U. S. Provisional Application No. 60/335,146 filed Nov. 14, 2001.

BACKGROUND OF THE INVENTION

1. Field of the Invention

This invention relates in general to the field of cantilever type electrical contactors, and more particularly to those that wipe (as "wipe" is defined below) across the termination surface or area of a device under test while making contact therewith.

2. Description of the Prior Art

In the field of miniature electronic devices there are numerous devices, such as miniature capacitors having conductive end terminations, that require testing to insure the quality of their electronic capabilities. These devices are presently tested using one of two types of contactors where the contactors are used to temporarily connect to the conductive ends for the purpose of electrical measurement. The first type is a "wiping" or cantilever contactor and the second is an "actuated" contactor.

A cantilever-type contactor typically has a flat spring metal arm which is canted or angled with respect to the device to be contacted. At the free end of the arm is a contactor. The contacting area of the device under test (hereinafter called a "DUT") is moved, actually or relatively, such that the contactor rubs or passes, i.e., "wipes", across the area and the cantilever arm is deflected slightly. The spring in the arm applies pressure on the contact area of the DUT, sufficient pressure for good electrical contact. This wiping technique can use one cantilever arm and one, opposite, stationary contact point, or two cantilever arms, one at each end of the DUT.

The wiping method, although simple and reliable, has certain drawbacks. The contacting pressure, supplied by the cantilever arm, needs to be controlled carefully. Too little pressure will result in poor electrical contact, too much pressure can damage the termination, i.e., the contacting areas of the device being contacted, particularly when the terminations are coated with a tin or tin/lead solder plating. Termination damage to the device is defined as any removal of, or serious injury to, the solder plating, which is typically only 100–200 micro-inches thick. The cantilever contact tip, being relatively stationary, wipes across the entire exposed length of the device termination, creating a relatively large mark on the termination, greatly increasing the chances of termination damage.

Also, due to the increasing miniaturization of electronic devices, minimal clearance exist between the surface of the holding fixtures needed to hold the DUT and the device terminations. The result is that the cantilever tips periodically come into contact with the holding fixture. Since the cantilever tip is relatively stationary, it is abraded by the test fixture material, which is typically FR-4 glass epoxy, or a similar non-conductive material, which tends to have a moderate or high abrasive quality. The cantilever tips become rough from this contact and tend to further damage the DUT terminations. Also, the contactor tips become dirty, either by oxidation or adherence of contaminants to the contact tips, or a combination of both. Access to the contact tips for cleaning is difficult due to the close proximity of the contact tips to the DUT and the device holding fixture(s).

The actuated contactor technique uses moving contact tips, usually in a reciprocating motion, which are brought into contact with the DUT. The contact tips are actuated for each test cycle, moved until they make contact with the DUT, then remain stationary during the measurement process. After measurement, the contacts are moved away from the DUT and the holding plate or fixture is indexed, bringing the next DUT into position for the next measurement. Actuated contacts can be made with very small tip sizes in order to reduce any marking of the termination ends of the tested device, unlike the wiping contact technique. Due to the high throughput of production testing equipment, this actuation cycle must be done at a very high speed and at rapid rates. For example, a component tester such as the Palomar Model 3300 would require 37,500 contactor actuation cycles per hour, running 150,000 parts per hour. If the components used for the actuation mechanism lasted 30,000,000 cycles, they would have to be replaced every 40 days, assuming 20 hours of machine run time per day. If the actuation time was only 10 micro-seconds in each actuation direction, the system throughput would be decreased by 10,000 parts per hour. Actuated contacts can also push or pull the DUT out of its holding plate/fixture, and the contact tips tend to be more expensive, requiring moving or flexible electrically conductive components, such as gold plated springs, or very flexible wire segments.

Prior art cantilever type contactors also include a roller supported by an axle that is, in turn, housed between a pair of spaced-apart flanges and held therein by an overhead axle clamp to form a rolling contactor. The flanges are supported by the cantilever arm and, when testing is under way, the arm and flanges are lowered to a point where the roller is brought into contact with the top of the device termination. The DUT is moved under the roller, making contact therewith, and test signals, passed through the device from the other end (or vice versa), are received in the roller and passed upward through the axle, then to the flanges, and into the arm for transmittal to a test device located at the remote end of the cantilever arm. Thus designed, contact between the roller and the DUT termination is a product of three distinct downward forces, to wit: the downward force of the cantilever spring arm, the downward force of the axle clamp, and the downward force of the axle against the inside rim of the roller. When measurement takes place, these three downward forces are balanced by the upward force of the DUT through contact between the DUT termination surface and the outer surface of the roller.

While the use of these rollers has ushered in a general improvement over the prior art of high speed device testing, the three combined forces often prove too severe for the DUT termination and cause damage to the surface of the termination. Once the surface is damaged, the device is no longer able to perform its electrical functions in high quality electronic environments and is relegated to other, low quality uses. Accordingly, there continues to be a need for a testing contactor that will provide rapid, positive contact with the DUT termination yet not be as positive in downward force as to cause damage to the termination surface.

In addition, the prior art contactors are in some cases, ganged together and set side-by-side in groups of four (4) or more so that four different DUTS could be brought into simultaneous contact with one set of four contactors to increase the throughput of the machine. The prior art does not provide adequate control to the level of the rollers causing one or more rollers to lie above or below another. To insure positive contact with the highest roller, the other rollers are pushed down harder to bring all the rollers, including the highest roller, into positive contact with the termination surfaces of their respective DUTs resulting in different pressures being brought to bear on the various devices. This difference in pressure often causes false readings on test equipment as well as damage to the DUT termination surfaces.

This invention is a contactor that will allow rapid and repeated electrical connection to the terminations of many types of DUTS with little or no damage or markings to their respective surfaces. The electrical contactor according to this invention is a significant advance over the prior art. It eliminates the damage done to the solder plating on the terminations of devices due to the "wiping" action of the cantilever type contactors and is simpler and has a longer life than the actuated type contactor. It is particularly useful in component handlers and testers for the processing and testing of electrical circuit components, for example ceramic capacitors. (As used herein the term "component" refers to ceramic capacitors and any other electrical device having a form that allows it to be contacted by this invention).

SUMMARY OF THE INVENTION

This invention is a rolling contactor for providing electrical signal communication between a component terminal and a support structure for the rolling contactor, comprising a circular roller of finite thickness, forming an outer rolling surface and an inner, centralized hole, between two, spaced-apart side walls, for rolling across the termination surface of a DUT. A pair of circular spools of smaller outside diameter than the roller, each located adjacent one of the roller side walls and concentric thereto, is provided wherein each spool has formed therethrough a centralized hole for the support axle. An axle bracket is adapted to receive an axle clamp thereover and support the axle in a rotational position to allow the roller to rotate and press against the termination surface of the component. At least one conductive brush is provided that extends into contact with one of the spools in tangential arrangement to pick up the signals from the roller surface. Finally, an elongated spring arm extends between the axle bracket and the support structure, to complete the electrical path between the termination surface of the DUT, the roller and the spool in contact with the axle bracket through the conductive brush, and to provide spring pressure to press the roller against the termination surface.

While the contact force on the DUT of the prior art was always the greater of the forces required for electrical connection of the axle and inside rim of the roller or the connection of the roller and the DUT, the invention allows the DUT to encounter only the force needed for a reliable connection of the roller to the DUT. Contact forces that are needed for electrical connection internal to the invention, namely the force of the conductive brush against the spool, are not exerted on the DUT. Additionally, the conductive brush pushes upwardly against the spool, which, in turn, pushes the roller in an upward direction against the axle. This causes the bottom of the axle to be in contact with bottom of the inside rim of the roller in all states, whether the cantilever arm is exerting downward force on the roller or not. Any clearances between the axle and the inside rim of the roller are thereby removed. This is particularly valuable when the contacts are initially moved downward towards the DUT to determine the initial point of contact of the bottom of the roller to the DUT, since any "play" in the fit of the inside rim of the roller on the axle is effectively removed.

This has significance to the ganged contactors by allowing them to be aligned more easily such that the new alignment reduces the overall difference between the highest and the lowest roller thus providing more of an average pressure on the four DUTs set side-by-side as aforesaid.

Accordingly, the main object of this invention is a contactor that exerts less pressure on an underlying DUT termination surface than those in the prior art. Other objects include a contactor that can be used and cycled for longer periods of time and test more DUTs than other, prior art devices, before having to be replaced; a contactor that may be used more consistently and display more accuracy than prior art contactors; and, a contactor that can be more accurately ganged to provide testing to a plurality of DUTs to increase throughput and output of the testing machines.

These and other objects of the invention will become more clear when one reads the following specification, taken together with the drawings that are attached hereto. The scope of protection sought by the inventors may be gleaned from a fair reading of the claims that conclude this specification.

DESCRIPTION OF THE PREFERRED EMBODIMENT

Figure 1:
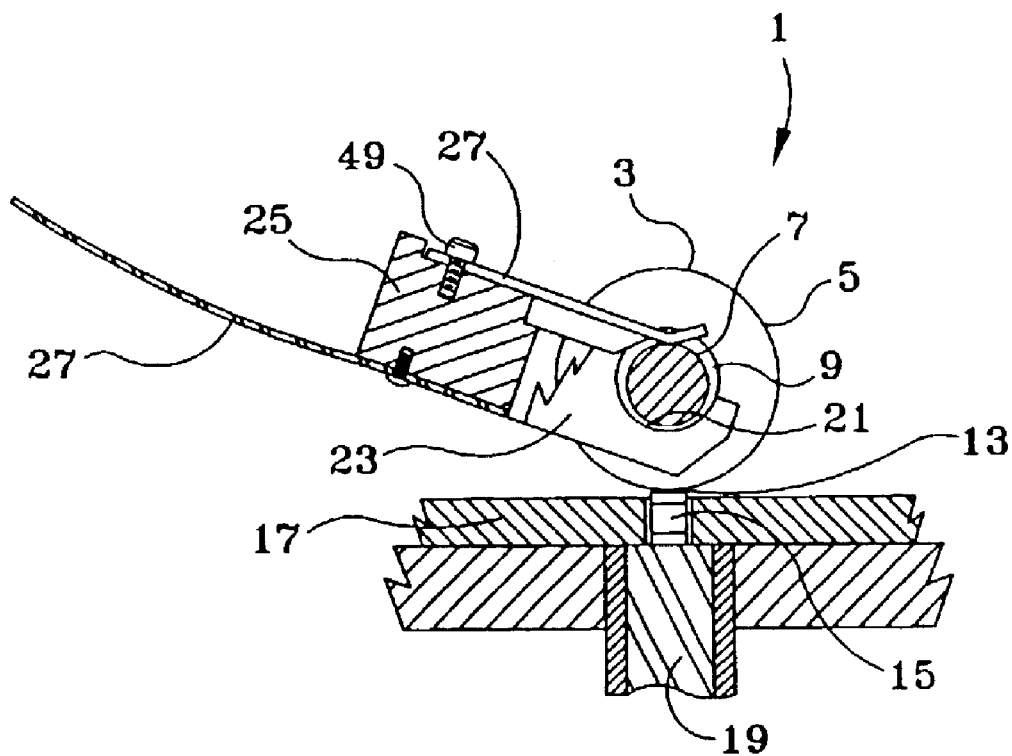
FIG. 1 is a sectional side view of a typical prior art roller-wiper type contactor.

Turning now to the drawings, wherein elements are identified by numbers and like elements are identified with like numbers throughout the six figures, FIG. 1 shows the construction of the prior art form of contactors to comprise a roller contactor 1 including an electrical conductive roller 3 having a circular outer rolling surface 5 supported for concentric rotation about an axle 7 passing through a centralized hole 9 formed centrally in roller 3 and extending there beyond. Roller 3 is made of an electrically conductive material such as brass, steel, aluminum and may have a highly conductive, non-reactive nobel metal outer surface such as platinum, gold, or silver. Roller 3 preferably should be no thicker than the width of the terminal that it is designed to pass in contact with and is bordered between two, spaced-apart, mutually parallel side walls (not shown). Roller 3 passes (rolls) over the upper termination 13 of a DUT 15, in this case a ceramic capacitor, held in a holding plate 17 on top of a bottom support 19 that acts as the other electrode in the test process. In practice, an electrical test signal is introduced into DUT 15 through bottom support 19 and passes upward through the DUT and out termination 13. The signal is picked up at outer rolling surface 5 of roller 3 and passed into axle 7, through a pair of spaced-apart axle-support grooves 21 formed in a pair of spaced-apart flanges 23 (only one is shown) that support axle 7 (and roller 3) on a roller bracket 25 that anchors roller 3 to an elongated spring arm 27 for passing the signal to a test device (not shown).

Figure 2:
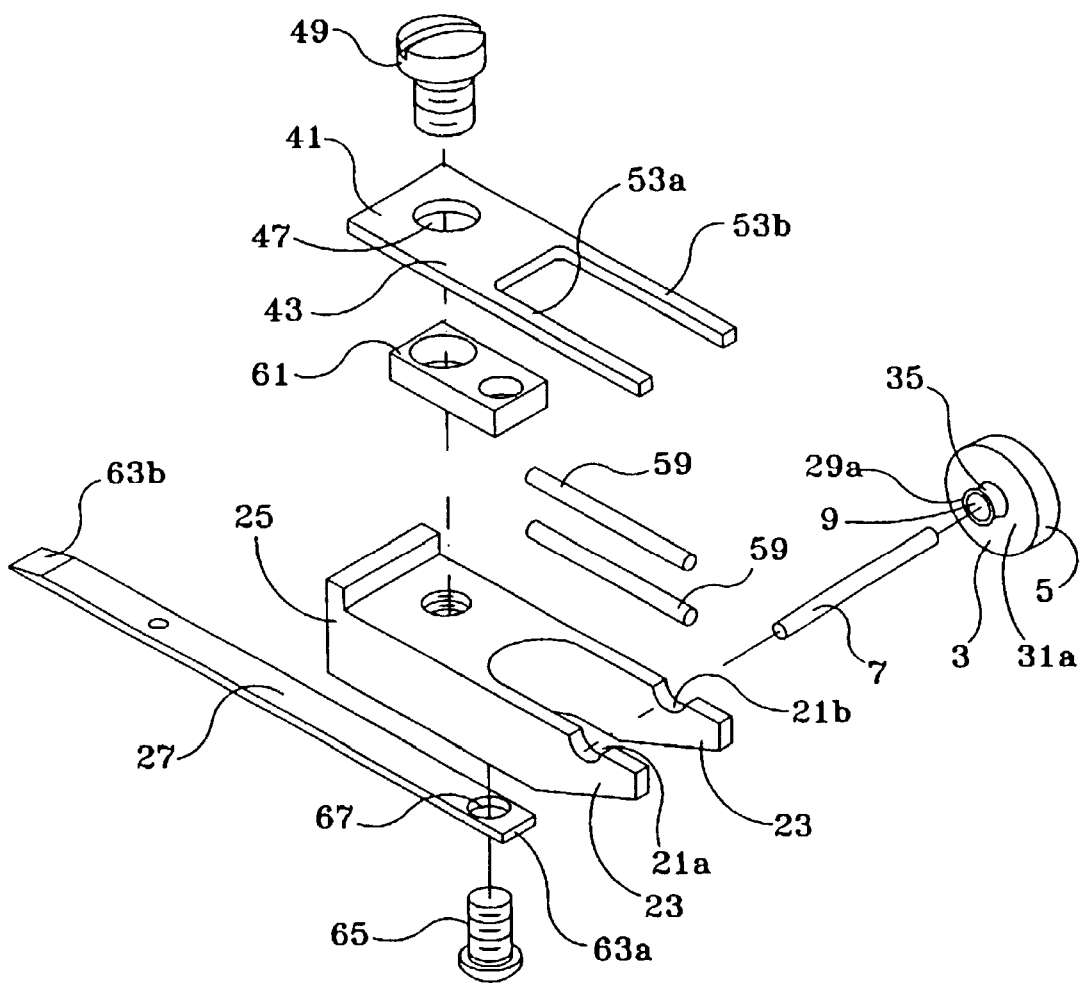
FIG. 2 is an exploded view of the preferred embodiment of this invention showing some of the components that make up the contactor of this invention.
Figure 4B:
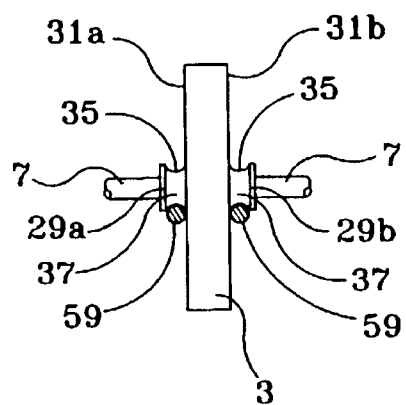
FIG. 4b is a side view of another embodiment of the roller, spools and brushes of this invention; and, FIG. 5 is a perspective view of a plurality of brushes of this invention ganged together for testing a plurality of DUTs.
Figure 3:
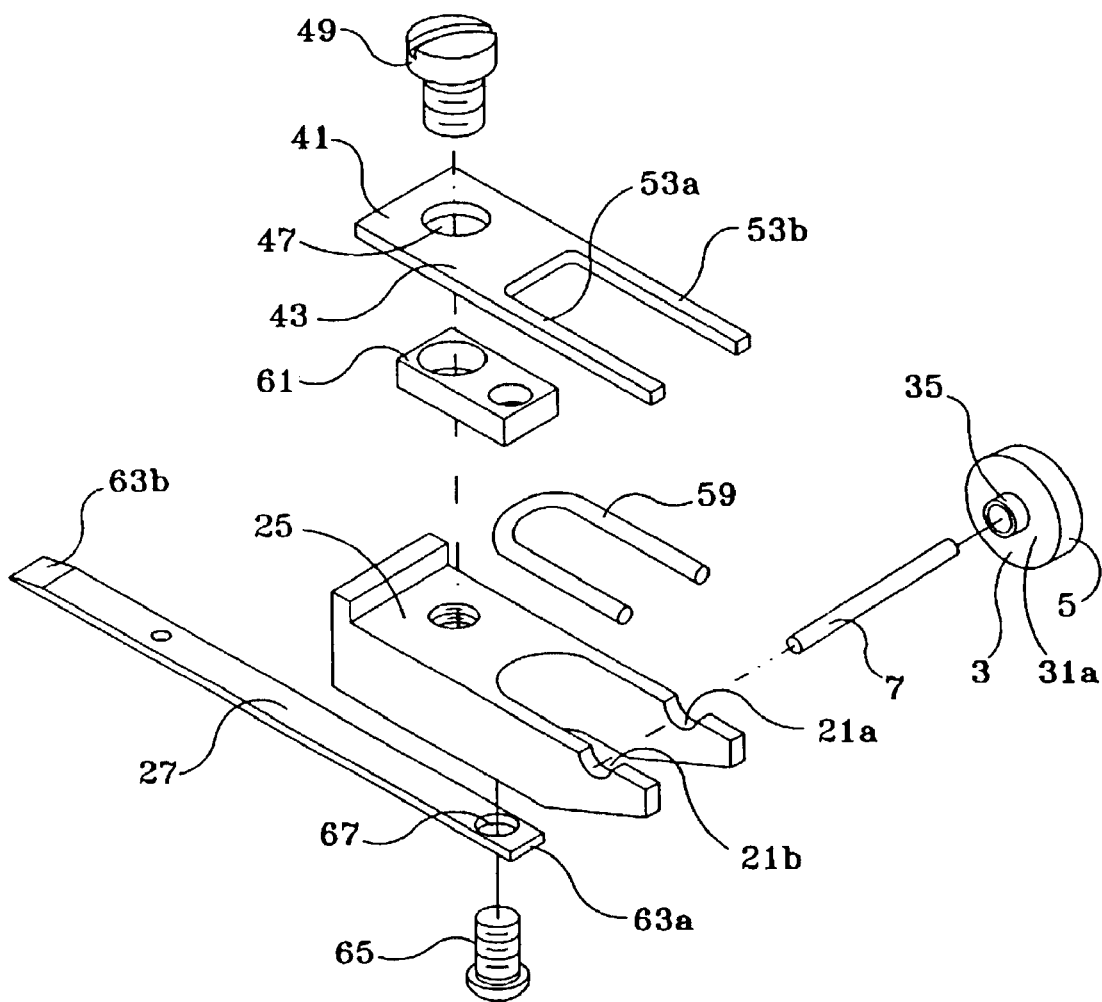
FIG. 3 is an exploded view of another embodiment of the brushes of this invention showing some of the components that make up the contactor of this invention.
Figure 4A:
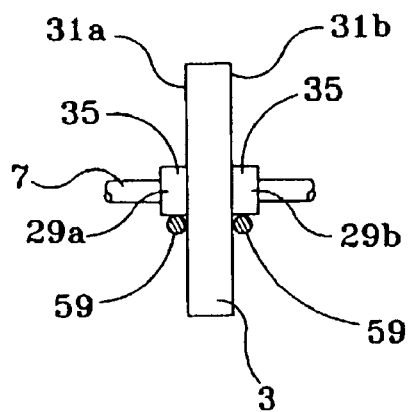
FIG. 4a is a side view of the preferred embodiment of the roller, spools and brushes of this invention.
Figure 5:
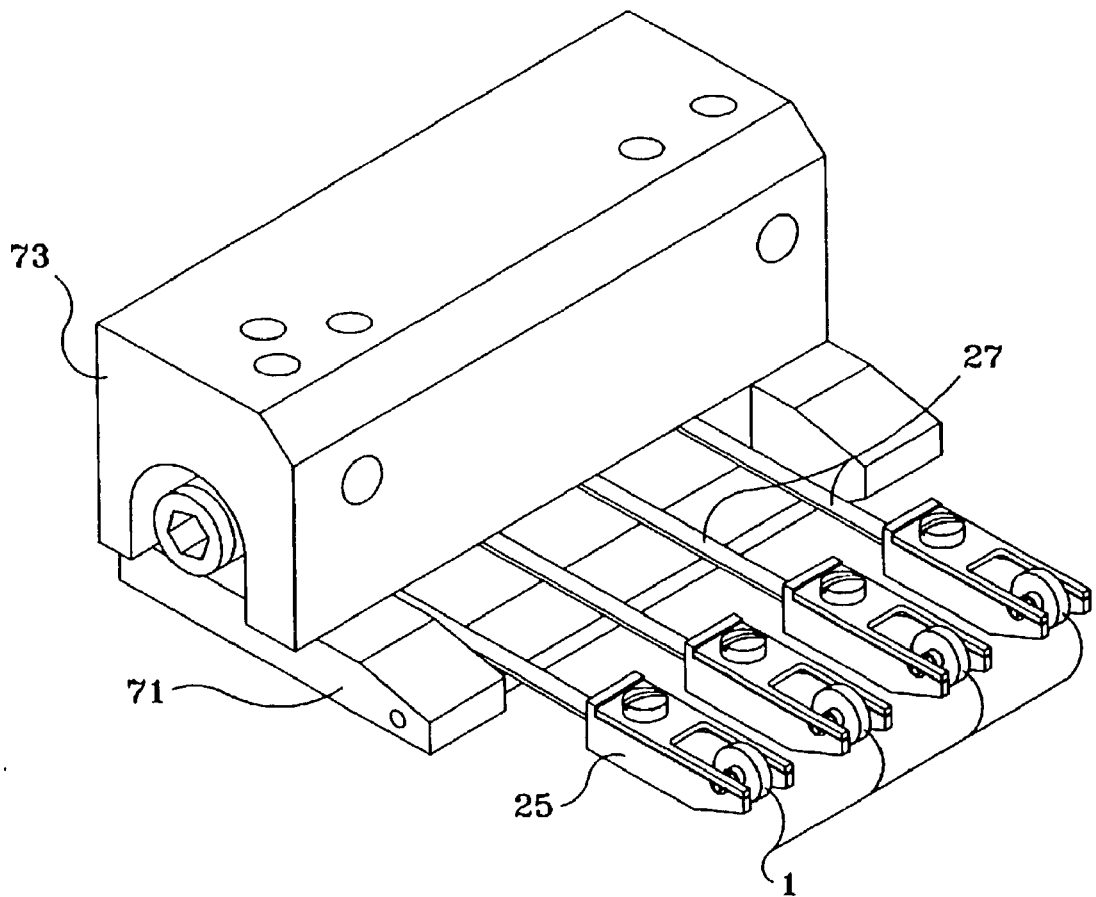

As shown in FIGS. 2, 3, 4a and 4b, this invention comprises a pair of relatively thin, circular spools 29a and 29b are located adjacent, and preferably against the side walls 31a and 31b of roller 3 and are adapted to turn with roller 3 on axle 7. Most preferably, spools 29a and 29b are formed with roller 3 in a single, monolithic unit so that electronic signals picked up from terminal surface 13 of DUT 15 are transmitted, without significant attenuation, through roller 3 and spools 29a and 29b. Spools 29a and 29b are of smaller outside diameter than roller 3 and are thinner than roller 3 to allow a plurality of rollers 3 to be mounted in side-by-side arrangement as shown in FIG. 5. The perimeter or peripheral surface 35 of spools 29a and 29b are preferably formed parallel to outer rolling surface 5 of roller 3 as shown in FIG. 4a. In another embodiment of the invention, shown in FIG. 4b, a small groove or furrow 37 is formed on spool peripheral surface 35. In both embodiments, the peripheral surface 35 of spools 29a and 29b are provided for receipt thereon, in tangential contact, with at least one brush.

A two-fingered axle clamp 41 is provided having a body 43 forming a hole 47 therein for passage there through of a hold-down bolt 49 to hold clamp 41 down on roller bracket 25. Spaced-apart fingers 53a and 53b extend over grooves 21a and 21b and retain axle 7 therein.

At least one, but preferably two, electrically conductive brushes 59 extend outward from bracket 25 and contact peripheral spool surface 35 for reception of the electrical signal obtained from roller 3 and to pass said signal on to bracket 25. Preferably, a pair of brushes 59, in the form of either a pair of straight wires, as shown in FIG. 2, or a U-shaped brush assembly, as shown in FIG. 3, extends from bracket 25, held thereto by a brush retainer 61, as shown in FIGS. 2 and 3, and in tangential contact with peripheral surface 35 (either flat surface or furrow 37).

An elongated spring arm 27, electrically conductive and defined by spaced-apart first and second terminal ends 63a and 63b, is provided to which roller bracket 25 is attached by a bolt 65 received through a hole 67, formed in end 63a, and into a threaded opening (not shown) formed in the underside of bracket 25. As attached to spring arm first terminal end 63a, bracket 25 holds the assembly of roller 3, axle 7, spools 29a and 29b, and brushes 59 in operative alignment to allow signals to be picked up in roller 3 from a terminal end of a DUT, passed into spools 29a and/or 29b to be further picked up by brushes 59 and passed into bracket 25 for transmittal along spring arm 27 to second end 63b that is held in assembly in a support structure 71 (see FIG. 5) for resiliently cantilevering rolling contactor 1 from support structure 71, so as to flex in response to deflection of roller 3 by a DUT.

Referring to FIG. 5, rolling contactors 1 of FIGS. 4a–4b can be installed in parallel into support structure 71 for simultaneously contacting multiple DUTs (not shown). (In this regard, it should be understood that the single contactor shown in FIGS. 2 and 3 can be installed and fitted into support structure 71 in the same manner as the multiple contactors.) Support structure 71 is illustrated in FIG. 5 to be secured to a test handler jig 73, (not fully shown). The plurality of the cantilever rolling contactors 1 are held longitudinally in place in support structure 71.

The embodiments described above can be used in an arrangement in which the contactors of this invention make contact with one of the terminals of a component, e.g. one end of a surface mount ceramic capacitor, with the other terminal being contacted by a stationary contact. However, rolling contactors can be used for contacting both of the terminals, depending on the arrangement of the test handler. Likewise, multiple contact modules could be constructed to allow two contactors, in close proximity, to make contact with a single terminal of the device being tested. The other terminal of the electrical device could also be contacted by either stationary contacts or also by one or two rolling contacts.

The foregoing description and drawings were given for illustrative purposes only, it being understood that the invention is not limited to the embodiments disclosed, but is intended to embrace any and all alternatives, equivalents, modifications and rearrangements of elements falling within the scope of the invention as described herein. While the invention has been described with reference to a particular embodiment thereof, those skilled in the art will be able to make various modifications to the described embodiment of the invention without departing from the true spirit and scope thereof It is intended that all combinations of elements and steps which perform substantially the same function in substantially the same way to achieve substantially the same result are within the scope of this invention.

What is claimed is:

1. A rolling contactor for providing electrical signal communication between a conductive terminal surface of a miniature electronic device under test (DUT) and a support structure for said rolling contactor, comprising:
   a) an electrically conductive circular roller of finite thickness, having formed thereon an outer rolling surface and an inner, centralized hole, between two, spaced-apart side walls, for rolling across the conductive terminal surface of the DUT to communicate one or more signals therewith;
   b) at least one electrically conductive circular spool of smaller outside diameter than said roller, located adjacent and in contact with one of said roller side walls, having formed therethrough a centralized hole;
   c) a support axle adapted to pass axially through said centralized holes formed in said roller and said spool and extending there beyond;
   d) an electrically conductive axle bracket adapted to support said axle in a rotational arrangement about said axle to allow said roller surface to rotate and press against the termination surface of the DUT;
   e) an electrically conductive brush extending from said axle bracket into tangential contact with said spool during rotation thereof; and,
   f) an electrically conductive elongated spring arm extending between said axle bracket and the support structure, to complete the electrical path between the termination surface of the DUT, said rolling surface and said spool in contact with said axle bracket through said conductive brush, and to bias spring pressure to press said roller against said termination surface.

2. The rolling contactor of claim 1 further including an additional spool of smaller outside diameter than said roller, located adjacent and in contact with the other roller side wall, having formed therethrough a centralized hole, and an additional electrically conductive brush extending from said axle bracket to contact said additional spool in tangential contact during rotation thereof.

3. The rolling contactor of claim 1 wherein said circular roller is of a thickness no greater than the width of the termination surface of the DUT to which it is to contact.

4. The rolling contactor of claim 1 wherein said outer roller surface is concentric with the outer surfaces of said pair of circular spools.

5. The rolling contactor of claim 1 wherein said two, spaced-apart side walls of said roller are planar and mutually parallel.

6. The rolling contactor of claim 1 wherein said inner, centralized hole in said roller and said inner, centralized holes in said circular spools are aligned on said axle to cause said outer surface of said roller and the outer surfaces of said spools to lie in concentric arrangement.

7. The rolling contactor of claim 1 further including a flat peripheral surface formed parallel to said outer rolling surface of said circular roller for sliding receipt therein of said electrically conductive brushes to pick off the electrical signals passing through said roller from said roller surface.

8. The rolling contactor of claim 1 further including a furrowed surface formed about the perimeter of each said circular spools and for sliding receipt therein of said electrically conductive brushes to pick off the electrical signals passing through said roller from said roller surface.

9. The rolling contactor of claim 1 wherein said circular spools and said roller are formed in a single monolithic unit.

10. The rolling contactor of claim 1 further including two said electrically conductive brushes, in spaced-apart arrangement, extending in parallel arrangement from said axle bracket to contact each of said spools in tangential arrangement during rotation thereof.

11. The rolling contactor of claim 1 wherein said electrically conductive, elongated spring arm includes first and second terminal ends in spaced-apart arrangement.

12. The rolling contactor of claim 10 wherein said first terminal end of said electrically conductive, elongated spring arm comprises:

a) a pair of flanges projecting orthogonally from opposite sides of said elongated spring arm;

b) a pair of aligned grooves defined by said respective flanges for journaling the axle ends therein, the axle being disposed normal to the arm; and, c) means for resiliently cantilevering said rolling contactor from a support structure, so as to flex in response to deflection of said rolling contactor when rolling by the DUT.

13. A rolling contactor for providing electrical signal communication between a component terminal and a support structure for said rolling contactor, comprising:

a) a plurality of electrically conductive circular rollers set in side-by-side arrangement, each said roller of finite thickness, each having formed thereon an outer rolling surface and an inner, centralized hole, between two, spaced-apart side walls, for rolling across the conductive terminal surface of a device under test (DUT), arranged in side-by-side position, to communicate one or more signals therewith;

b) at least one electrically conductive circular spool for each roller, each said spool of smaller outside diameter than said roller, located adjacent and in contact with one of said roller side walls, having formed therethrough a centralized hole;

c) a support axle for each roller adapted to pass axially through said holes formed in said roller and said spool and extending there beyond;

d) an electrically conductive axle bracket adapted to support each said axle in a rotational arrangement thereabout to allow said roller surface to rotate and press against the termination surface of the DUT;

e) an electrically conductive brush extending from each said support axle bracket to contact said spool in tangential arrangement during rotation thereof; and, f) an electrically conductive elongated spring arm extending between each said axle bracket and the support structure, to complete the electrical path between the termination surface of the DUT, said roller surface and said spool in contact with said axle bracket through said conductive brush, and to provide spring pressure to press said roller against said termination surface.

14. The rolling contactor of claim 13 further including an additional spool of smaller outside diameter than said roller, located adjacent and in contact with the other roller side wall, having formed therethrough a centralized hole, and an additional electrically conductive brush extending from said axle bracket to contact said additional spool in tangential contact during rotation thereof.

15. The rolling contactor of claim 13 wherein said circular rollers are of a thickness no greater than the width of the termination surface of the DUT to which they are to contact.

16. The rolling contactor of claim 13 wherein said outer roller surfaces are concentric with the outer surfaces of said pair of circular spools.

17. The rolling contactor of claim 13 wherein said two, spaced-apart side walls of each said roller are planar and mutually parallel.

18. The rolling contactor of claim 13 wherein said inner, centralized hole in each said roller and said inner, centralized holes in said circular spools are aligned on said axles to cause said outer surfaces of said rollers and the outer surfaces of said spools to lie in concentric arrangement.

19. The rolling contactor of claim 13 further including a flat peripheral surface formed about the perimeter of each said circular spools and for sliding receipt therein of said electrically conductive brushes to pick off the electrical signals passing through said roller from said roller surface.

20. The rolling contactor of claim 13 further including a furrow formed about the perimeter of each said circular spools and for sliding receipt therein of said electrically conductive brushes to pick off the electrical signals passing through said roller from said roller surface.

* * * * *